(12) United States Patent
Ichikawa

(10) Patent No.: US 7,102,210 B2
(45) Date of Patent: Sep. 5, 2006

(54) LEAD FRAME, MANUFACTURING METHOD OF THE SAME, AND SEMICONDUCTOR DEVICE USING THE SAME

(75) Inventor: Sunji Ichikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/763,227

(22) Filed: Jan. 26, 2004

(65) Prior Publication Data

US 2005/0051875 A1 Mar. 10, 2005

(30) Foreign Application Priority Data

Sep. 5, 2003 (JP) .............................. 2003-314581

(51) Int. Cl.
*H01L 23/495* (2006.01)
(52) U.S. Cl. ....................................... 257/666; 257/672
(58) Field of Classification Search ................. 257/666, 257/676, 672
See application file for complete search history.

(56) References Cited

U.S. PATENT DOCUMENTS 4,711,700 A * 12/1987 Cusack ........................ 216/14
5,025,114 A * 6/1991 Braden ...................... 174/52.4

FOREIGN PATENT DOCUMENTS

| JP | 48-15474 | 2/1973 |
|----|----------|--------|
| JP | 7-30051 | 1/1995 |
| JP | 10-135401 | 5/1998 |

* cited by examiner

*Primary Examiner*—Roy Potter
(74) *Attorney, Agent, or Firm*—Wenderoth, Lind & Ponack, L.L.P.

(57) ABSTRACT

In order to mount a semiconductor element of a small electrode pitch, an inner lead portion of a lead frame is made thin and narrow to reduce a pitch. Even a semiconductor element in which an electrode arrangement pitch is smaller than conventionally can be mounted by flip chip bonding, the number of components such as a wire is reduced, and a possibility of wire cutting or the like caused by vibration or the like during semiconductor device assembling is reduced. A fine inner lead formation scheduled area of a conductor plate is half-etched to make a plate thickness smaller than that in a peripheral area. Then, the fine inner lead formation scheduled area is patterned to form a fine inner lead portion 22. Especially, a width of a tip 22a of the fine inner lead portion 22 is set smaller than those of a middle inner lead portion 23 and an outer lead portion 25.

9 Claims, 10 Drawing Sheets

MANUFACTURING PROCESS OF LEAD FRAME (FIRST STEP)

MANUFACTURING PROCESS OF LEAD FRAME (SECOND STEP)

MANUFACTURING PROCESS OF LEAD FRAME (THIRD STEP)

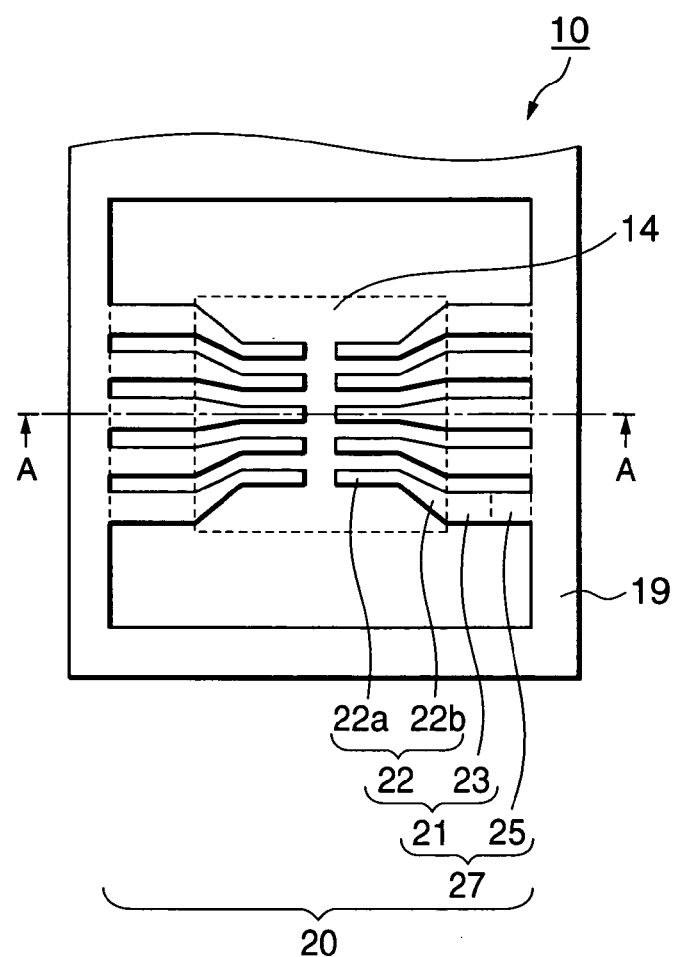
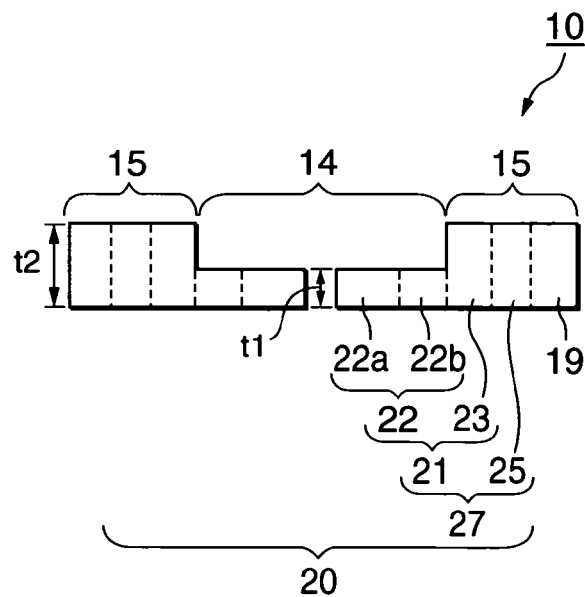
MANUFACTURING PROCESS OF LEAD FRAME (FOURTH STEP)

FIRST EMBODIMENTS OF SEMICONDUCTOR DEVICE AND LEAD FRAME

SECOND EMBODIMENT OF LEAD FRAME

THIRD EMBODIMENT OF LEAD FRAME

SECOND EMBODIMENT OF SEMICONDUCTOR DEVICE

THIRD EMBODIMENT OF SEMICONDUCTOR DEVICE

FOURTH EMBODIMENT OF SEMICONDUCTOR DEVICE

CONVENTIONAL EXAMPLE OF SEMICONDUCTOR DEVICE

LEAD FRAME, MANUFACTURING METHOD OF THE SAME, AND SEMICONDUCTOR DEVICE USING THE SAME

BACKGROUND OF THE INVENTION

1. Field of the Invention

This invention relates to a lead frame, a manufacturing method of the lead frame, and a semiconductor device that is packaged by using the lead frame.

2. Description of the Related Art

The development of a technology of a semiconductor integrated circuit has heightened a request for high-density mounting especially by using multiple pins. In response to such a request, various packaging forms have been developed for semiconductor devices.

There is a resin sealed package of a lead frame type as one of the packaging forms of the semiconductor devices. The resin sealed package has been widely used because of an inexpensive material and a shape that is suited to mass production.

In the package of the lead frame type, a semiconductor element and an inner lead portion of the lead frame are generally connected to each other through a metal wire (e.g., see Patent Document 1 as identified below).

A constitutional example of a conventional semiconductor device sealed by a resin sealed package 142 of a lead frame type will now be described with reference to FIG. 11. Two semiconductor elements 143a and 143b are mounted in the resin sealed package 142. One semiconductor element 143a is stuck to an upper surface of a dye stage 144 by a semiconductor element adhesive 145. An upper surface of the semiconductor element 143a is a circuit formation surface, and one end of a metal wire 149 is attached to a bonding electrode 150 on the circuit formation surface. Further, the other end of the metal wire 149 is connected to an inner lead portion of a lead frame 148.

An upper surface of the other semiconductor element 143b is a circuit formation surface, and one end of a tab lead 146 is attached to a bump 152 on the circuit formation surface. Further, the other end of the tab lead 146 is connected to the inner lead portion of the lead frame 148. The semiconductor element 143b to which the tab lead 146 is attached is disposed below the dye stage 144 through an insulating material 147.

If a metal wire is used for a connection between a semiconductor element and an inner lead portion of a lead frame, there is a possibility that wire cutting or the like will occur due to vibration or the like during package manufacturing. However, if a semiconductor chip and the inner lead portion are connected by flip chip bonding, the metal wire and a tab lead are made unnecessary. Thus, a possibility of metal wire cutting or the like can be eliminated, and the number of components can be reduced.

Patent Document 1: Japanese Patent Application Laid-Open No. 7 (1995)-30051 (claim 1 and FIG. 1)

SUMMARY OF THE INVENTION

However, the bonding electrodes on the semiconductor element are normally arranged at a pitch of about 80 to 200 μm, while an arrangement pitch of the inner lead portions of the lead frame is usually 180 μm or higher. Because of this difference in arrangement pitches, a semiconductor element which has bonding electrodes of an arrangement pitch of 180 μm or lower cannot be mounted by flip chip bonding. Such a limit of the arrangement pitch of the inner lead portions is defined by a lead frame thickness, and the lead frame thickness is in turn dependent on a processing limit of etching or mold processing.

The present invention has been made with the foregoing problems in mind. Accordingly, objects of the present invention are to provide a lead frame which enables mounting of a semiconductor element that is conventionally unmountable through flip chip bonding by reducing a pitch of inner lead portions of a lead frame, a manufacturing method of the lead frame, and a semiconductor device which uses the lead frame.

In order to achieve the foregoing objects of the present invention, a lead frame of the present invention has the following constitution. The lead frame comprises a plurality of leads that are arranged in parallel. Each of the plurality of leads is constituted by being divided into two portions of an inner lead portion and an outer lead portion. The inner lead portion has a fine inner lead portion, and a middle inner lead portion for interconnecting the fine inner lead portion and the outer lead portion. Each of the middle inner lead portion and the outer lead portion has a second thickness and a second width. The fine inner lead portion has a first thickness. The fine inner lead portion has a tip and a rear stage. The tip has a first width, and the rear stage has a width that is expanded from the first width of the tip to the second width of the middle inner lead portion. Further, the first thickness is smaller than the second thickness, and the first width is smaller than the second width.

A method for manufacturing the lead frame includes the following four steps. In a first step, a conductor plate is prepared. In a second step, a fine inner lead formation scheduled area is set in a center region of the conductor plate, and the fine inner lead formation scheduled area is half-etched to make a plate thickness smaller than that in a peripheral area of a nonetching target. In a third step, a first patterning process is executed in the fine inner lead formation scheduled area to form a fine inner lead portion. In a fourth step, a second patterning process is executed in the peripheral area to form a middle inner lead portion and an outer lead portion. In this case, the third and fourth steps are carried out after the second step, and the first and second patterning processes are carried out as different patterning processes.

In implementing the aforementioned manufacturing method, the second patterning process for forming the middle inner lead portion and the outer lead portion may preferably be executed by mold-processing the peripheral area.

An execution order of the third and fourth steps may be changed in accordance with a design.

A semiconductor device of the present invention is constituted by including the aforementioned lead frame and first and second semiconductor elements. An electrode of the first semiconductor element is connected through flip chip bonding to the fine inner lead portion of the lead frame by a bump formed on the electrode. The second semiconductor element is stuck to a surface opposite a surface of the lead frame on which the first semiconductor element is mounted by a semiconductor element adhesive. One end of a wire is attached to an electrode disposed on a surface which is opposite the surface of the second semiconductor element stuck to the lead frame. The other end of the wire is attached to the middle inner lead portion of the lead frame. Resin sealing is executed to include (seal) the inner lead portion of the lead frame and the first and second semiconductor elements. The outer lead portion of the lead frame is exposed from a resin-sealed portion.

According to a preferred embodiment of the lead frame of the invention, in addition to the original leads, the lead frame comprises a plurality of spare leads each of which is constituted by being divided into two portions of a spare inner lead portion and a spare outer lead portion. The spare leads are arranged in parallel to be apart from the leads in areas between the middle inner lead portions of the adjacent leads. Further, the spare leads are arranged from a boundary between the middle inner lead portion and the fine inner lead portion of the lead to the area of the outer lead portion side.

According to another embodiment of a semiconductor device of the present invention, the semiconductor device is constituted by including an inner lead portion of a lead frame and two pairs of first and second semiconductor elements. The two first semiconductor elements are connected through an anisotropic conductive sheet to front and back sides of the fine inner lead portion of the lead frame by electrodes disposed on the first semiconductor elements and bumps formed on the electrodes. The two second semiconductor elements are stuck to surfaces which are opposite surfaces of the first semiconductor elements stuck to the lead frame by a semiconductor element adhesive. One end of a wire is attached to an electrode disposed on a surface opposite the surface of each of the second semiconductor elements stuck to each of the first semiconductor elements. The other end of the wire is attached to the middle inner lead portion of the lead frame. Resin sealing is executed to include (seal) the inner lead portion of the lead frame and the two pairs of first and second semiconductor elements. The outer lead portion of the lead frame is exposed from a resin-sealed portion.

BRIEF DESCRIPTION OF THE DRAWINGS

FIG. 1A is a schematic plan view, and FIG. 1B is a sectional view cut along the line A—A of FIG. 1A;

FIG. 2A is a schematic plan view, and FIG. 2B is a sectional view cut along the line A—A of FIG. 2A;

FIG. 3A is a schematic plan view, and FIG. 3B is a sectional view cut along the line A—A of FIG. 3A;

FIGS. 4A and 4B are views illustrating the manufacturing process (fourth step) of the lead frame, where FIG. 4A is a schematic plan view, and FIG. 4B is a sectional view cut along the line A—A of FIG. 4A;

FIG. 5A is a schematic sectional view illustrating a first embodiment of the semiconductor device, and FIG. 5B is a schematic plan view illustrating a first embodiment of the lead frame;

FIG. 10A is a schematic sectional view showing the semiconductor device, and FIG. 10B illustrates plan, front and side views schematically showing a frame material used for the semiconductor device.

DETAILED DESCRIPTION OF THE PREFERRED EMBODIMENTS

The preferred embodiments of the present invention will now be described with reference to the accompanying drawings. However, constitutions and arrangement relations are only schematically shown so as not to hinder understanding of the present invention. Preferred constitutional examples of the present invention will be described. However, compositions (materials), numerical value conditions etc., of the constitutions are only preferred examples, and thus the present invention is not limited to the embodiments.

When a schematic view illustrating a constitutional example of a semiconductor device of the present invention is a sectional cut, hatching of the section is partially omitted.

(Method for Manufacturing Lead Frame)

A lead frame manufacturing method of the present invention will now be described with reference to FIGS. 1A to 4B. The description below will focus on one lead frame.

In a first step, a conductor plate 10 is prepared. A material of the conductor plate 10 is, e.g., copper. A plate thickness of the conductor plate 10 is set to, e.g., about 200 μm (see FIGS. 1A, 1B).

In a second step, a fine inner lead formation scheduled area 14 is set in a center region of the conductor plate 10. The fine inner lead formation scheduled area 14 is set as an area of an etching target, while a peripheral area 15 of the fine inner lead formation scheduled area 14 is set as an area of a nonetching target. Then, a resist pattern is formed which has an opening in the fine inner lead formation scheduled area 14 set as the etching target area, and covers the peripheral area 15 set as the nonetching target area. The fine inner lead formation scheduled area 14 is half-etched to set a plate thickness which is smaller than that of the peripheral area 15. The half-etching is preferably executed by chemical etching (see FIGS. 2A, 2B).

In this case, a plate thickness of the fine inner lead formation scheduled area 14 is about 100 μm, while a plate thickness of the peripheral area 15 is maintained at about 200 μm. In the constitutional example described here, a planar shape of the etching target area 14 is square. A size of the fine inner lead formation scheduled area 14 is decided by the arrangement of a bonding electrode disposed on a semiconductor element mounted on the lead frame.

Figure 1A:
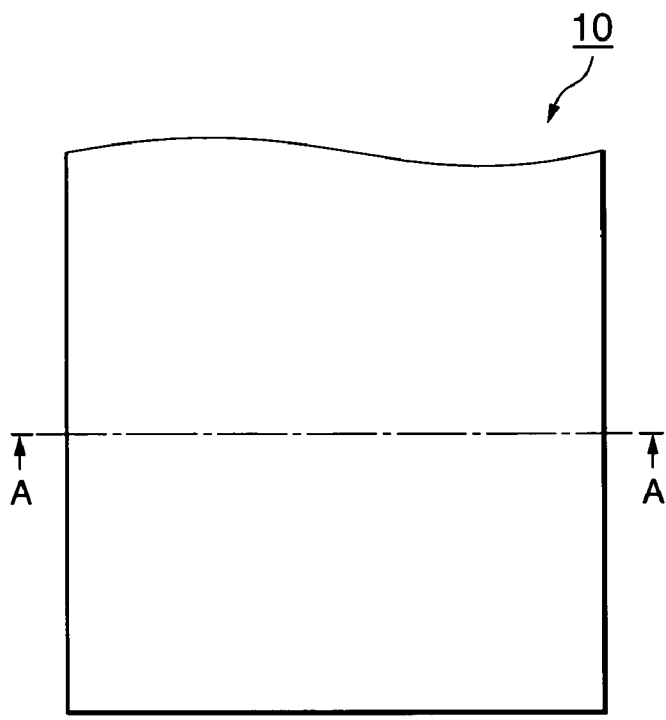
FIGS. 1A and 1B are views illustrating a manufacturing process (first step) of a lead frame, where
Figure 1B:
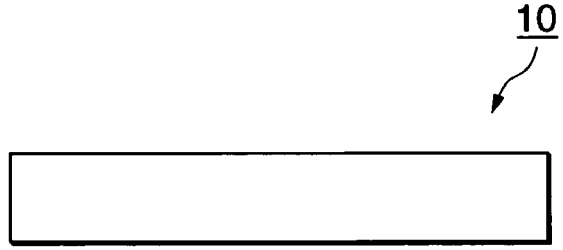
Figure 2A:
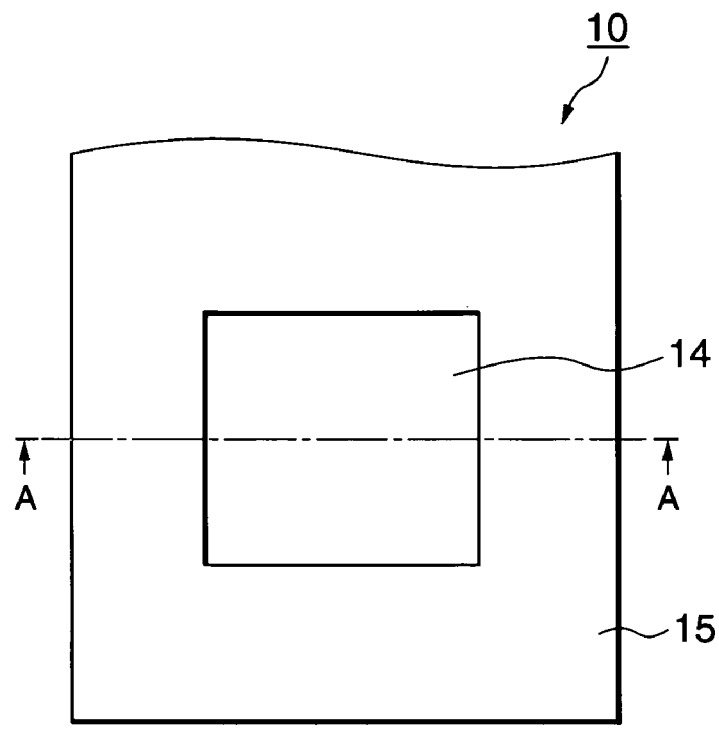
FIGS. 2A and 2B are views illustrating the manufacturing process (second step) of the lead frame, where
Figure 2B:
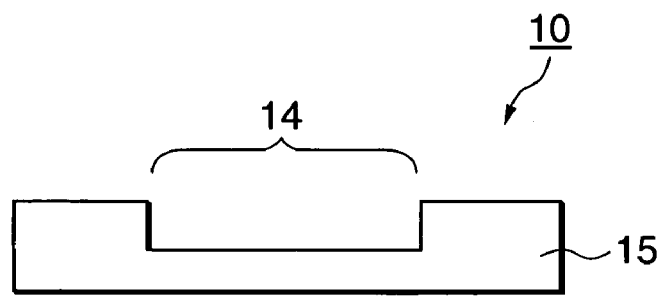
Figure 3A:
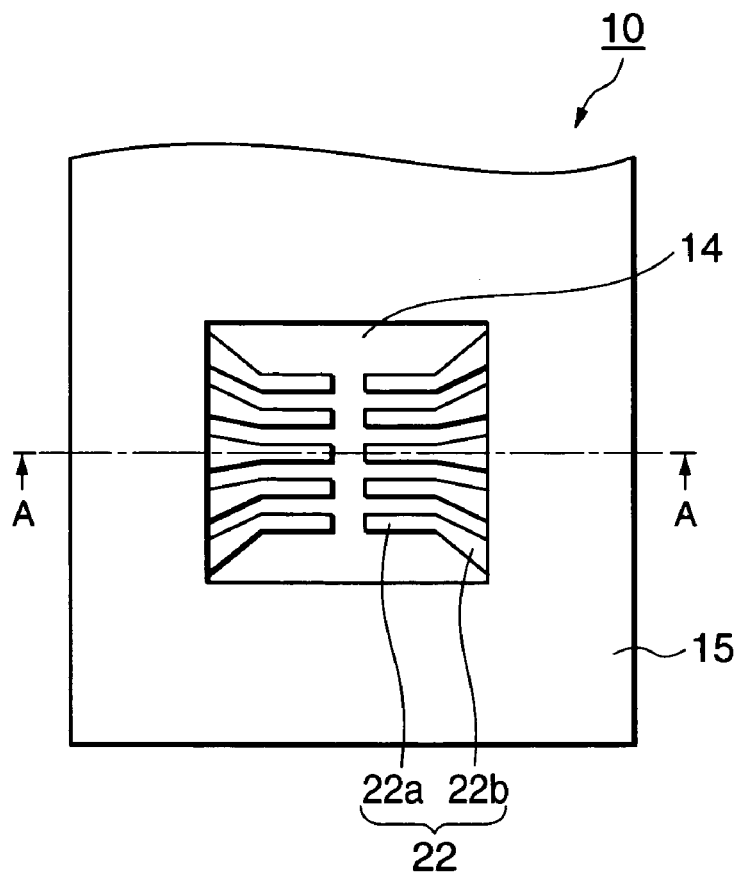
FIGS. 3A and 3B are views illustrating the manufacturing process (third step) of the lead frame, where
Figure 3B:
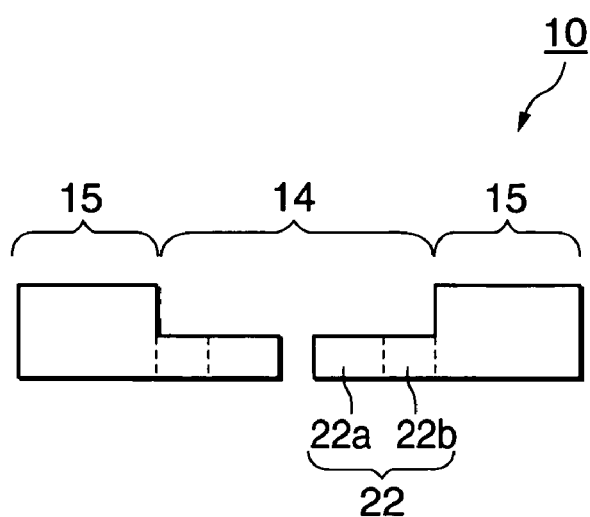

In a third step, the thin fine inner lead formation scheduled area 14 is patterned by a first patterning process to form a fine inner lead portion 22 (see FIGS. 3A, 3B).

In this patterning, first, a resist pattern is disposed to cover an area of the fine inner lead formation scheduled area 14 for forming a fine inner lead portion and the peripheral area 15. Then, a portion of the fine inner lead formation scheduled area 14 that is exposed from the resist pattern is preferably subjected to chemical etching to be removed, thereby completing the patterning.

Thus, if the resist pattern is disposed in the fine inner lead formation scheduled area 14 so as to coincide with a pitch of bonding electrodes of the semiconductor element, an arrangement pitch of fine inner lead portions 22 obtained after the etching removal is set to be equal to the arrangement pitch of the electrodes. Since the fine inner lead portion 22 can be formed narrow by making its thickness small, the arrangement pitch of the fine inner lead portions 22 can be reduced.

In a fourth step, the peripheral area 15 which is the nonetching target in the half-etching of the second step is patterned by a second patterning process to form a middle inner lead portion 23 and an outer lead portion 25 (see FIGS. 4A, 4B).

In this case, first, a resist pattern is disposed to cover the formed fine inner lead portion 22, an area in which the middle inner lead portion 23 and the outer lead portion 25 are formed, as well as a support frame 19 which supports these lead frames, and to expose the remaining peripheral area 15. Then, the exposed peripheral area 15 is preferably subjected to chemical etching to be removed. As a result, a lead frame 20 supported by the support frame 19 (also referred to as a frame) is formed.

If a material of the conductor plate 10 is copper, the half-etching of the second step and the patterning operations of the third and fourth steps are preferably carried out by chemical etching which uses iron chloride as an etching agent.

In the formation of the middle inner lead portion 23 and the outer lead portion 25 of the fourth step, since a lead frame pitch is permitted to be 180 μm or higher, these portions may be formed by mold processing of a conventional art as a second patterning process.

The mold processing is physical patterning. Thus, the patterning is easier than chemical patterning.

An execution order of the third and fourth steps may be changed in accordance with a design.

A lead frame of an arrangement pitch of about 180 μm has been conventionally manufactured. Thus, if a plate thickness of the fine inner lead formation scheduled area 14 is set to be about half of that of the peripheral area 15 of the nonetching target, an arrangement pitch of fine inner lead portions can be realized up to approximately 80 μm. In this case, a semiconductor element in which an arrangement pitch of bonding electrodes is about 80 μm can be mounted through flip chip bonding.

After the formation of the lead frame 20 that is supported by the support frame 19, components such as the semiconductor elements which are necessary for packaging are mounted on the inner lead portion 21 which comprises the fine inner lead portion 22 and the middle inner lead portion 23. Then, molding is carried out to include the inner lead portion 21 and the elements, i.e., resin sealing is carried out, and then the lead frame 20 is cut off from the support frame 19 to complete a resin sealed package.

(Lead Frame)

First Embodiment

Figure 5A:
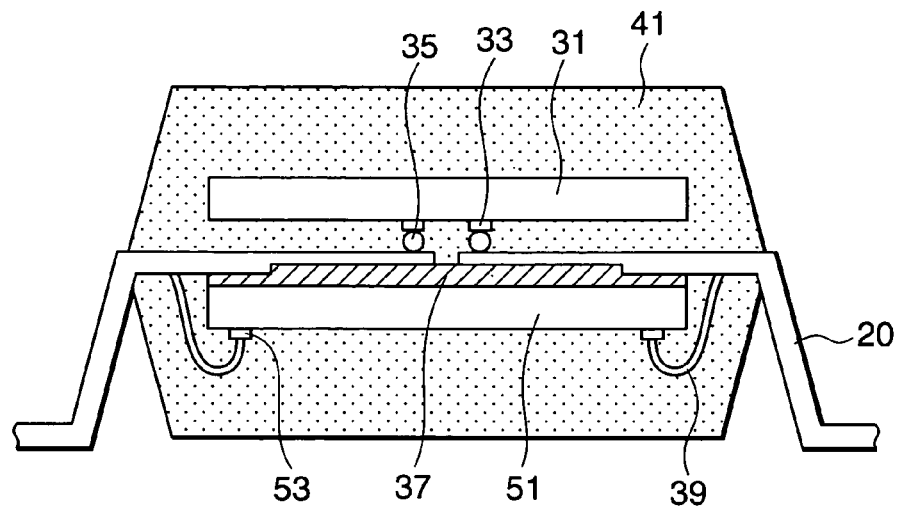
FIGS. 5A and 5B are views illustrating a semiconductor device and a lead frame used for the semiconductor device, where
Figure 5B:
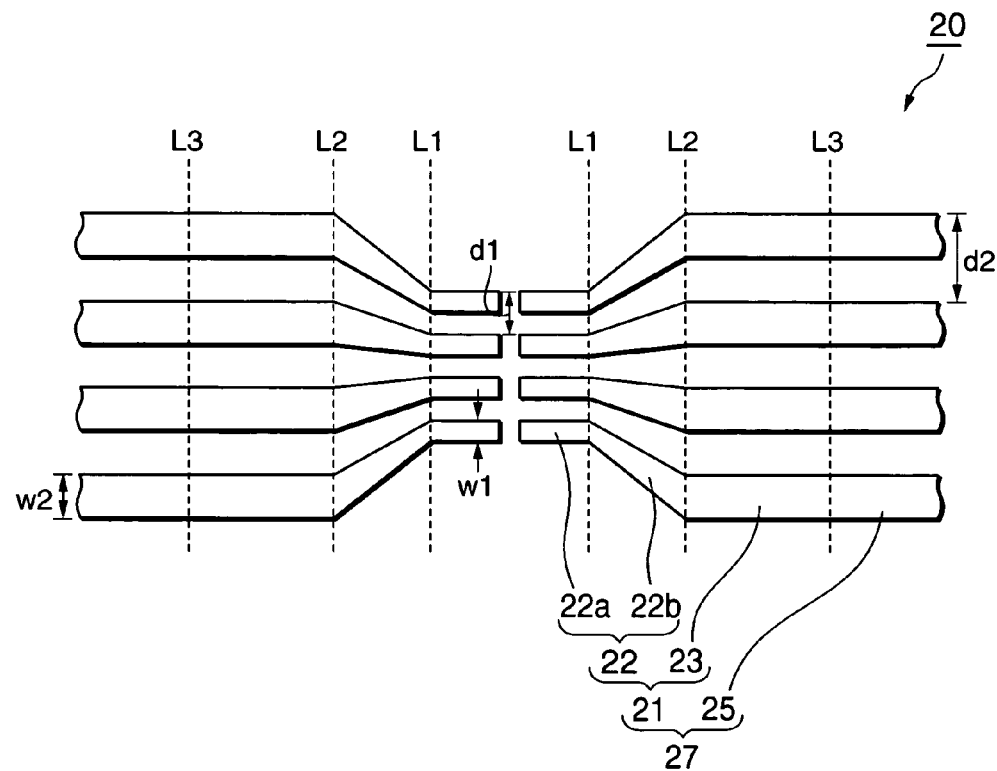

A structure of the lead frame manufactured by the foregoing method will be described by referring to FIGS. 4B and 5B. This lead frame is used for a resin sealing (molding) package of a lead frame type which is one of the packaging forms of the semiconductor device.

The lead frame 20 comprises a plurality of leads 27 that are substantially arranged in parallel. Each of the leads 27 is constituted by being divided into two portions of an inner lead portion 21 and an outer lead portion 25. A portion of the lead frame 20 included in the package is the inner lead portion 21, and a portion exposed to the outside of the package is the outer lead portion 25.

The inner lead portion 21 has a fine inner lead portion 22, and a middle inner lead portion 23 for interconnecting the fine inner lead portion 22 and the outer lead portion 25. The fine inner lead portion 22 is freely conducted to an external opponent of a connection through the middle inner lead portion 23 and the outer lead portion 25.

Each of the middle inner lead portion 23 and the outer lead portion 25 has a second thickness t2 and a second width w2.

The fine inner lead portion 22 has a first thickness t1. The first thickness t1 is smaller than the second thickness t2. The fine inner lead portion 22 has a tip 22a, and a rear stage 22b continuous from the tip. The tip 22a of the fine inner lead portion 22 has a first width w1. The first width w1 is smaller than the second width w2. The rear stage 22b of the fine inner lead portion 22 is preferably expanded in width from the first width w1 of the tip to the second width w2 of the middle inner lead portion. In FIG. 5B, a boundary between the tip 22a and the rear stage 22b of the fine inner lead portion is denoted by L1, a boundary between the fine inner lead portion 22 and the middle inner lead portion 23 is denoted by L2, and a boundary between the middle inner lead portion 23 and the outer lead portion 25 is denoted by L3.

When the plurality of leads 27 are arranged in parallel, an arrangement pitch of the inner lead portions 21 is normally about twice as large as a width of each inner lead portion 21. It is now assumed that an arrangement pitch of the tips 22a of the finer inner lead portions 22 is a first pitch d1, and an arrangement pitch of the middle inner lead portions 23 is a second pitch d2. In this case, the second pitch d2 is approximately 180 μm or higher, while the first pitch d1 is about 80 μm. As an electrode pitch of a generally used semiconductor element is approximately 80 to 200 μm, in the aforementioned example, the first pitch d1 of the tip 22a of the fine inner lead portion 22 is about 80 μm, but this first pitch d1 can be set to 80 μm or lower by making the first width w1 smaller in accordance with a thickness of the tip 22a.

The embodiment has been described by way of example in which the rear stage 22b of the fine inner lead portion 22 has a width that is tapered from the middle inner lead portion 23 side to the tip 22a. However, the width of the rear stage 22b may be set to a constant width which is equal to that of the tip 22a.

Second Embodiment

A structure of a lead frame 20a of a second embodiment will be described by referring to FIG. 6. A constitutional difference of the lead frame of the second embodiment from that of the first embodiment is a structure in which a spare lead 28a is additionally disposed.

The spare leads 28a are arranged in parallel to be apart from the original leads 27 in areas between the middle inner lead portions 23 of the adjacent original leads 27 arranged in parallel. Each of the spare leads 28a is positioned for its front stage edge in any position in an area of the outer lead portion 25 side from a boundary between the middle inner lead portion 23 and the fine inner lead portion 22 of the original lead 27 to be extended to the outer lead portion side.

Each spare lead 28a is constituted by being divided into two portions of a spare inner lead portion 24a and a spare outer lead portion 26a. Thus, in the spare lead 28a, a portion corresponding to the fine inner lead portion 22 of the original lead 27 is not formed.

Figure 6:
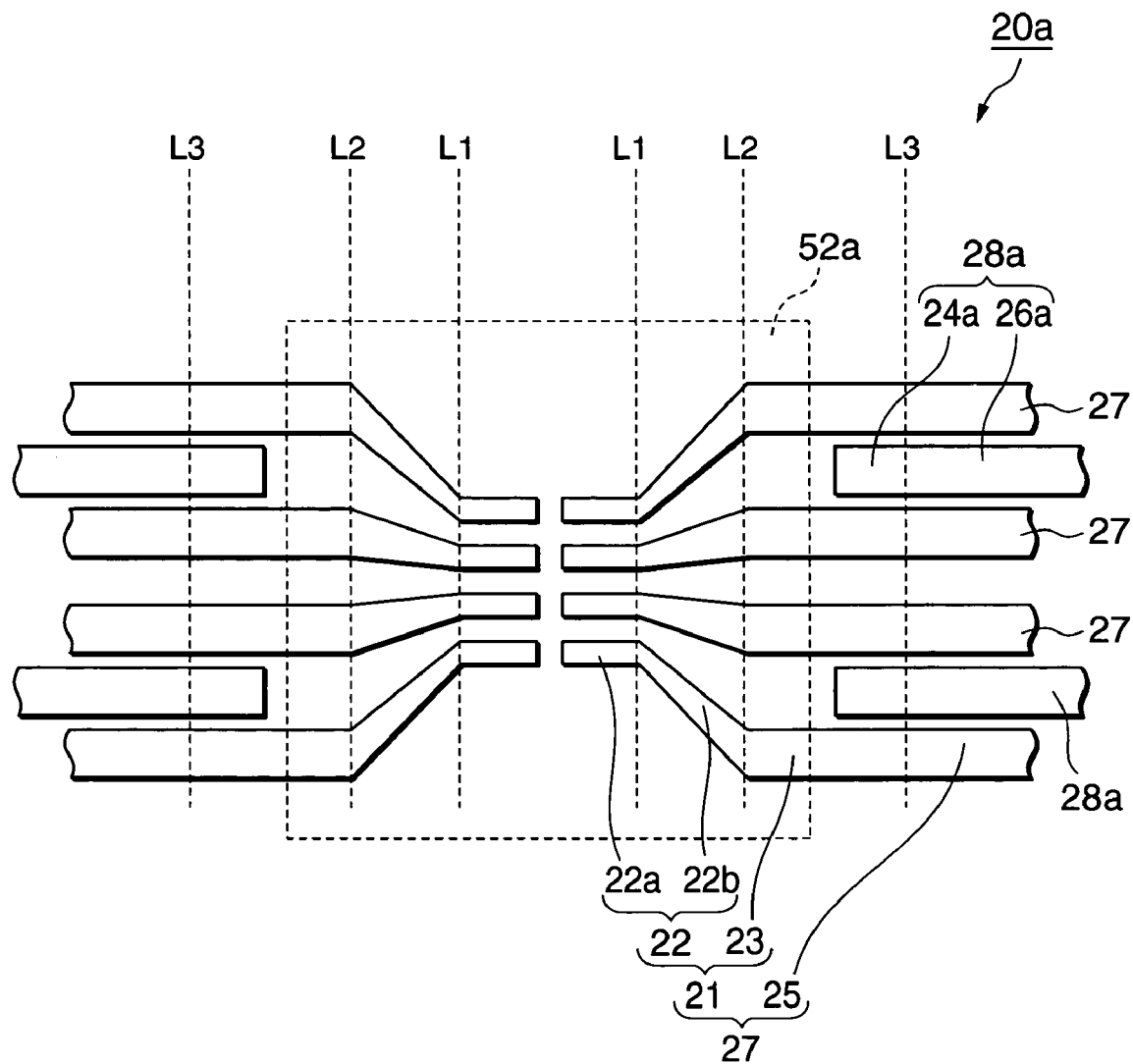
FIG. 6 is a schematic plan view illustrating a second embodiment of a lead frame of the present invention.

As shown in FIG. 6, a maximum occupied area 52a when a second semiconductor element 51 is mounted on the lead frame is indicated by a dotted line. The spare lead 28a is formed in a package so that a spare inner lead portion 24a can be arranged in an area outside the occupied area 52a. The spare lead 28a may be formed simultaneously with the formation of the original lead 27. A necessary number of spare leads 28a may be disposed between the two original leads 27 as the occasion demands.

According to the lead frame constitution which comprises the spare leads, a bonding electrode of the second semiconductor element can be connected to the lead which is different from the lead connected through flip chip bonding to the bonding electrode of the first semiconductor element. Moreover, even if the first and second semiconductor elements are different from each other in the number of bonding electrodes, or arrangement thereof, they can be mounted on one lead frame.

Third Embodiment

Next, a structure of a lead frame 20b of a third embodiment will be described by referring to FIG. 7. A constitutional difference of the lead frame 20b of the third embodiment from that of the second embodiment is the constitution itself of a spare lead 28b.

Figure 7:
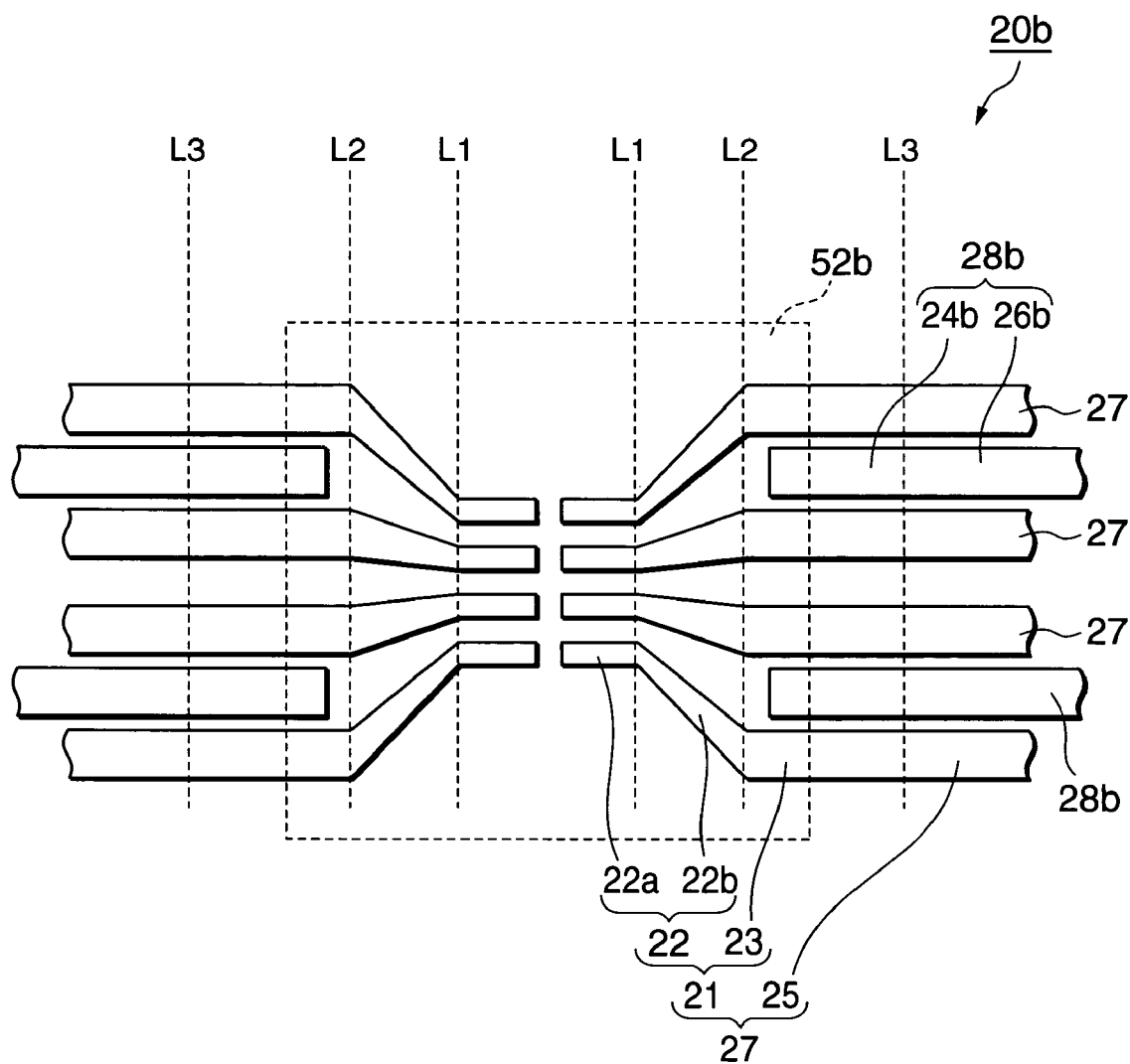
FIG. 7 is a schematic plan view illustrating a third embodiment of a lead frame of the present invention.

In the lead frame 20b of the third embodiment, as apparent from a comparison of the constitutional examples of FIGS. 6 and 7, a spare inner lead portion 24b is formed longer than that in the case of the second embodiment, and extended so as not to reach a boundary L2 to the inside of an occupied area 52b of a second semiconductor element 51. Accordingly, in this case, a tip of the spare inner lead portion 24b is fixed to a front surface side of the second semiconductor element by a semiconductor element adhesive on the second semiconductor element 51. Since the spare inner lead portion 24b is fixed to the second semiconductor element 51, it is possible to prevent deformation of the spare inner lead portion 24b during assembly of a semiconductor device.

(Semiconductor Device)

First Embodiment

A constitution of a semiconductor device which uses the foregoing lead frame will be described by referring to FIGS. 5A and 5B.

A first semiconductor element 31 is mounted on a lead frame 20. One surface of the first semiconductor element 31 is a circuit formation surface, and a bonding electrode 33 is disposed thereon as an electrode. A solder bump 35 is formed as a bump on the bonding electrode 33. By this solder bump 35, the bonding electrode 33 of the first semiconductor element 31 is connected through flip chip bonding to, especially, a tip 22a of a fine inner lead portion 22 of the lead frame 20.

A second semiconductor element 51 is stuck to a surface opposite a surface of the lead frame 20 on which the first semiconductor element 31 is mounted by a semiconductor element adhesive 37. This semiconductor element adhesive is an insulating adhesive which contains an epoxy resin.

A surface opposite a surface of the second semiconductor element 51 stuck to the lead frame 20 is a circuit formation surface. One end of a metal wire 39 is attached as a bonding wire through solder bonding or the like to a bonding electrode 53 on the circuit formation section. The other end of the metal wire 39 is attached through solder bonding or the like to a middle inner lead portion 23 of the lead frame 20.

Resin sealing is carried out to cover an inner lead portion 21 of the lead frame 20 and the first and second semiconductor elements 31 and 51. An outer lead portion 25 of the lead frame 20 is exposed from a resin sealed package 41.

If the bonding electrodes 33 and 53 of the first and second semiconductor elements 31 and 51 are similarly arranged, and an arrangement pitch of the bonding electrodes 33 and 53 coincides with that of the tips 22a of the fine inner lead portions 22 of the lead frame 20, the second semiconductor element 51 can be mounted through flip chip bonding as in the case of the first semiconductor element 31.

Second Embodiment

Figure 8:
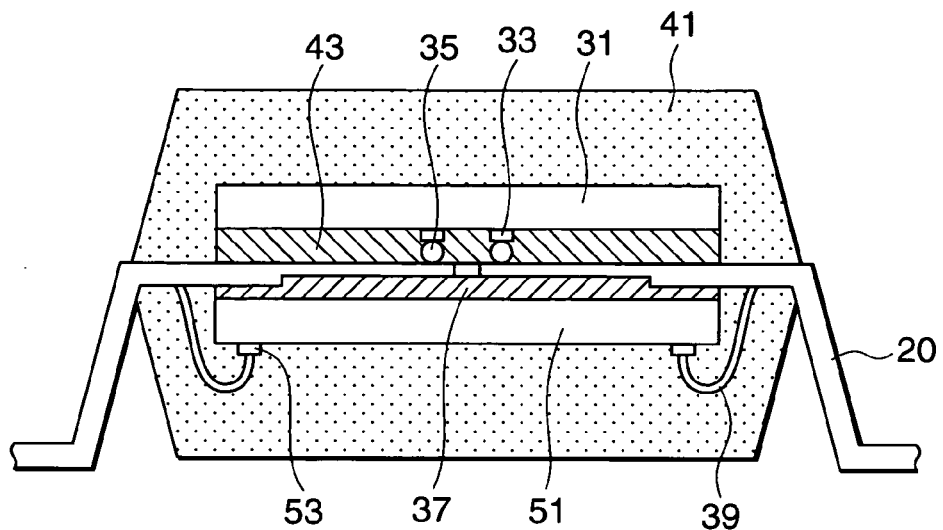
FIG. 8 is a schematic sectional view illustrating a constitution of a second embodiment of a semiconductor device of the present invention.

A constitution of a second embodiment of a semiconductor device of the present invention will be described by referring to FIG. 8. A difference from the first embodiment is that an insulating resin, e.g., an epoxy resin 43, fills a space between an inner lead portion 21 of a lead frame 20 and a first semiconductor element 31.

A reason for the disposition of the insulating resin layer of the epoxy resin 43 or the like is as follows. When a mold resin is disposed to envelope the semiconductor element, a bonding metal wire or the like mounted on the lead frame 20, the mold resin enters the space between the inner lead portion 21 of the lead frame 20 and the first semiconductor element 31. Application of pressure at the time of the resin entry may expand a gap between the first semiconductor element 31 and the inner lead portion 21. Consequently, there is a possibility of the generation of cracks in a solder bump.

However, according to the second embodiment, before molding, the space between the first semiconductor element 31 and the inner lead portion 21 is filled with the epoxy resin 43 to form a resin layer beforehand. By this epoxy resin 43, entry of the mold resin to the space between the semiconductor element 31 and the inner lead portion 21 during molding is prevented. Thus, there is no possibility of the generation of cracks in the solder bump 35, and therefore a highly reliable semiconductor device can be provided.

Third Embodiment

Figure 9:
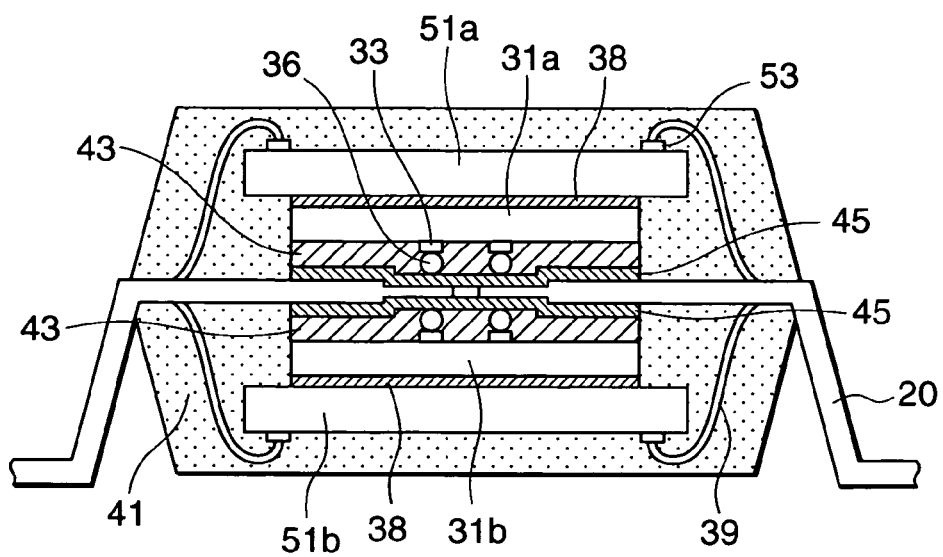
FIG. 9 is a schematic sectional view illustrating a constitution of a third embodiment of a semiconductor device of the present invention.

A constitution of a third embodiment of a semiconductor device of the present invention will be described by referring to FIG. 9.

According to the third embodiment, two first semiconductor elements 31a and 31b are mounted on a lead frame 20 in a state in which bonding electrodes face each other. One surface of each of the two first semiconductor elements 31a and 31b is a circuit formation surface, and a bonding electrode 33 is disposed thereon as an electrode. An Au bump 36 is formed as a bump on the bonding electrode 33. By the Au bump 36, the bonding electrode 33 is connected through an anisotropic conductive sheet 45 to front and back sides of a fine inner lead portion 22 of the lead frame 20. A tip 22a of the fine inner lead portion 22 of the lead frame 20 is etched to equal depths from both sides of a conductor plate to be removed, thereby being formed as a thin portion in a center of the conductor plate.

In this case, the anisotropic conductive sheet 45 has a structure which includes an area of a conductor in an insulating sheet. Normally, an insulating state is set between two optional points of the anisotropic conductive sheet 45. By heating and pressing during bonding, the area of the conductor in the heated and pressed anisotropic conductive sheet 45 is connected. As described above, the anisotropic conductive sheet 45 is a sheet which can set a conductive state between front and back sides of a predetermined place, and insulating states in other portions.

As in the case of the foregoing second embodiment of the semiconductor device, according to the third embodiment, a space between each of the first semiconductor elements 31*a* and 31*b* and the inner lead portion 21 of the lead frame 20 is filled with an epoxy resin 43.

Two second semiconductor elements 51*a* and 51*b* are stuck to surfaces that are opposite the surfaces of the first semiconductor elements 31*a* and 31*b* which are connected to the lead frame 20 by semiconductor element adhesives 38.

One end of a metal wire 39 is attached to a bonding electrode 53 disposed on a surface opposite each of the surfaces of the second semiconductor elements 51*a* and 51*b* that are stuck to the first semiconductor elements 31*a* and 31*b*. The other end of the metal wire 39 is attached to a middle inner lead portion 23 of the lead frame 20. The connection of the metal wire 39 to the bonding electrode 53 and the middle inner lead portion 23 is carried out through solder bonding or the like.

Resin sealing (molding) 41 is carried out to cover the inner lead portion 21 of the lead frame 20 and the two pairs of the first and second semiconductor elements 31*a*, 31*b*, and 51*a*, 51*b*. An outer lead portion 25 of the lead frame 20 is exposed to the outside from the mold portion 41.

According to the third embodiment, since a pair of first semiconductor elements and a pair of second semiconductor elements are mounted on the front and back sides of the lead frame, one semiconductor device can exhibit characteristic of two, and high-density mounting is possible.

Fourth Embodiment

Figure 10A:
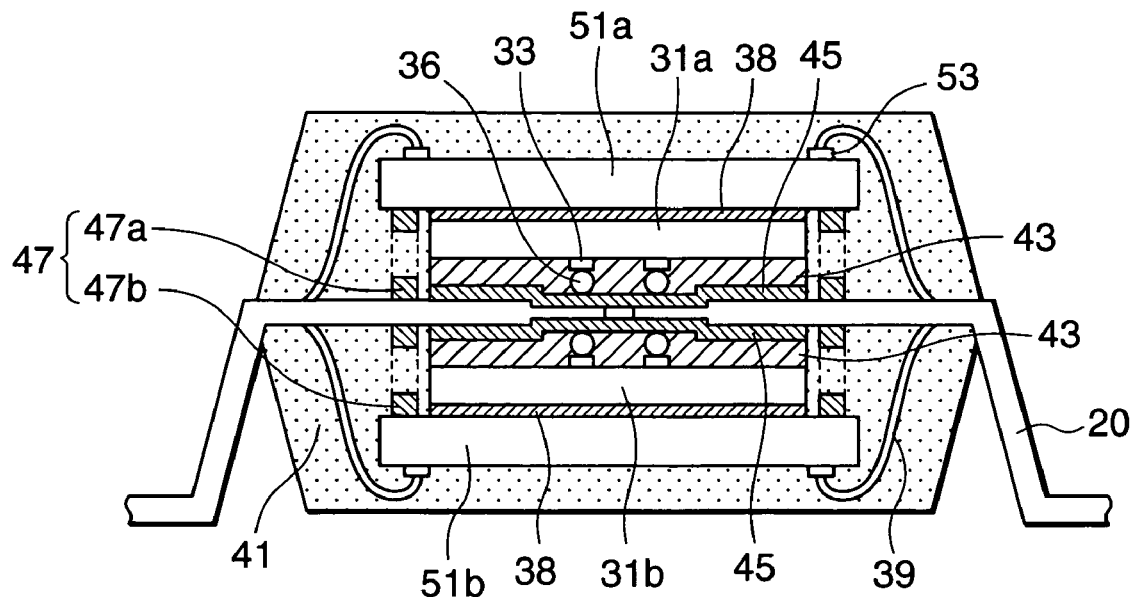
FIGS. 10A and 10B are views illustrating a constitution of a fourth embodiment of a semiconductor device of the present invention, where
Figure 10B:
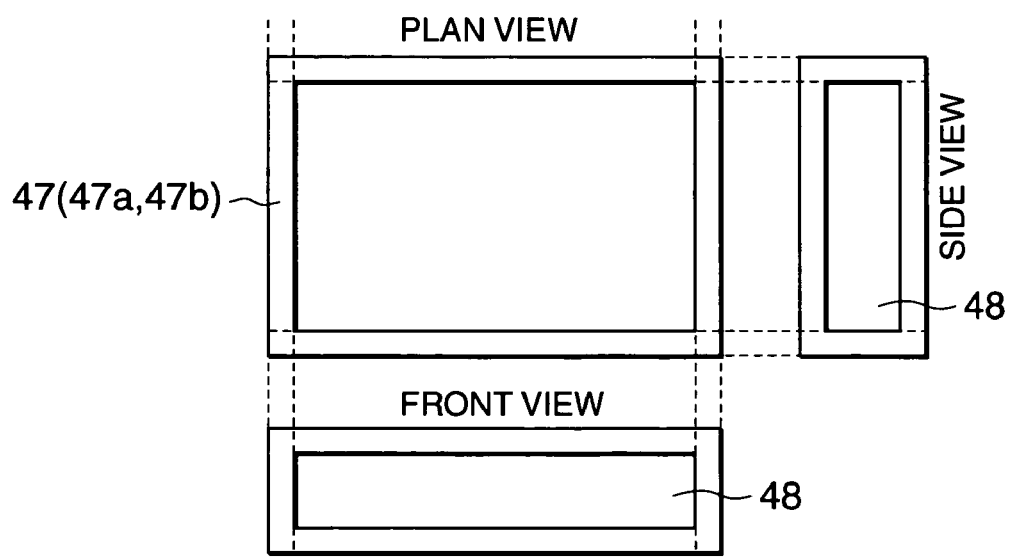
Figure 11:
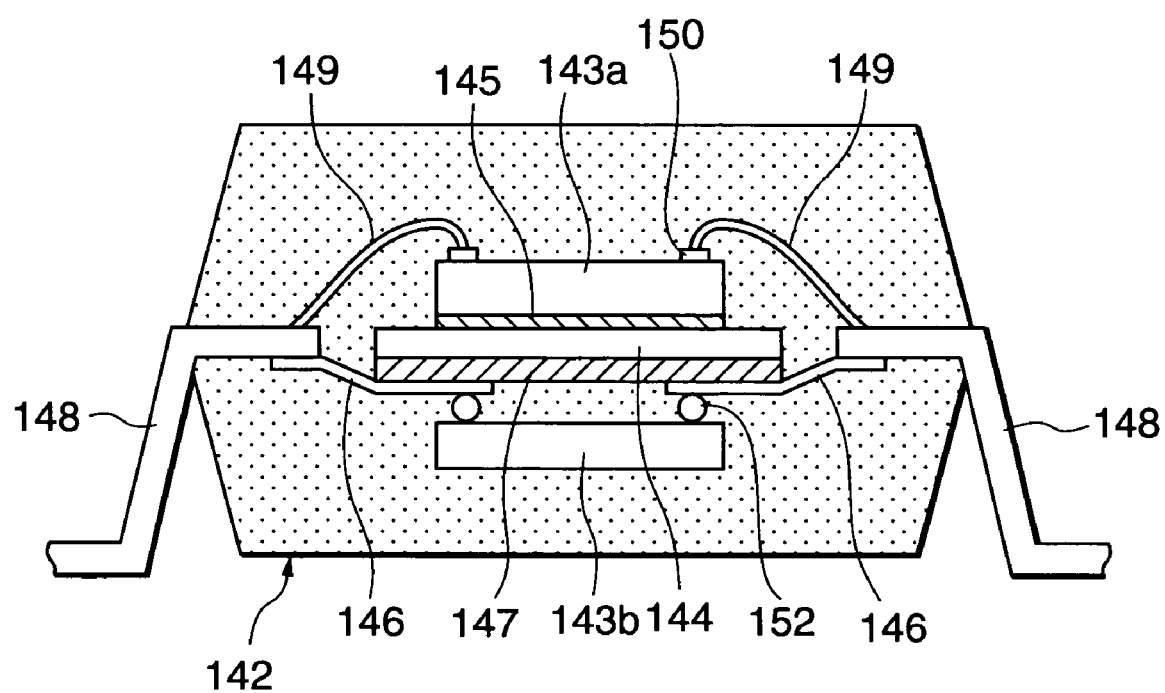
FIG. 11 is a sectional view illustrating a semiconductor device of a conventional example.

A constitution of a fourth embodiment of a semiconductor device of the present invention will be described by referring to FIGS. 10A and 10B. According to the fourth embodiment, use of a frame material 47 to fix second semiconductor elements 51*a* and 51*b* is different from the semiconductor device of the third embodiment. Here, a structure of the frame material 47 of the fourth embodiment will be mainly described.

The frame material 47 has a sectional shape of surrounding a first semiconductor element which is similar to that obtained by cutting a rectangular portion which is equal in size and shape to the first semiconductor element out of a rectangle which is equal in size and shape to a second semiconductor element. Two frame materials 47 are disposed: one frame material 47*a* being used for fixing one second semiconductor element 51*a*, and the other frame material 47*b* being used for fixing the other second semiconductor element 51*b*. A height of the frame material 47 is approximately equal to a distance from the middle inner lead portion 23 of the lead frame 20 to each of the second semiconductor elements 51*a* and 51*b*.

The frame materials 47*a* and 47*b* are attached by epoxy resins or the like (not shown) to the middle inner lead portion 23 to individually surround the first semiconductor elements 31*a* and 31*b*. Further, the second semiconductor elements 51*a* and 51*b* are similarly fixed to the frame materials 47*a* and 47*b* by epoxy resins or the like (not shown).

An opening or a slit 48 is bored on each side face of the frame material 47 to inject a mold resin.

Since the second semiconductor elements 51*a* and 51*b* are fixed by the frame materials 47, when the second semiconductor elements 51*a* and 51 are connected by the metal wire 39, vibration thereof is suppressed, and vibration of the inner lead portion of the lead frame is also suppressed. Thus, a possibility of wire cutting or the like is reduced, and a highly reliable semiconductor device can be provided.

According to the lead frame of the present invention, since the tip of the inner lead portion of the lead frame is smaller in width than the middle inner lead portion, the arrangement pitch of the tips of the inner lead portions is small, and the semiconductor element can be mounted even through flip chip bonding.

According to the lead frame manufacturing method of the present invention, the fine inner lead formation scheduled area is half-etched to set the plate thickness smaller than that in the peripheral area of a nonetching target, and then, the fine inner lead formation scheduled area and the peripheral area are subjected to different patterning processes. Thus, the tip of the fine inner lead portion of the inner lead portion can be formed narrower than that of the conventional inner lead portion. It is therefore possible to reduce the arrangement pitch of the fine inner lead portions.

According to the lead frame manufacturing method of the invention, if the second patterning process is mold processing, the patterning becomes easier than chemical patterning because the mold processing is physical patterning.

According to the semiconductor device of the present invention, since the fine inner lead portion of the lead frame is narrower than that of the conventional lead frame, the arrangement pitch of the fine inner lead portions can be set smaller than that of the conventional lead frame. Thus, the number of components such as a wire can be reduced by flip chip bonding. Moreover, since no wire is used to mount the first semiconductor element, there is no fear that a phenomenon of wire cutting which has conventionally been possible due to vibration or the like during the semiconductor assembly will occur.

According to the lead frame of the present invention comprising the plurality of spare leads each of which is divided into the two portions of the spare inner lead portion and the spare outer lead portion, the electrode of the second semiconductor element can be connected to the lead that is different from the lead connected to the electrode of the first semiconductor element through flip chip bonding. Even if the first and second semiconductor elements are different from each other in the number of electrodes or electrode arrangement, they can be mounted on one lead frame.

The two first semiconductor elements are mounted on the front and back sides of the fine inner lead portion of the lead frame through the anisotropic conductive sheet. Further, the two second semiconductor elements are mounted on the surface that is opposite the surface connected to the lead frame by the semiconductor element adhesive. Thus, one semiconductor device can exhibit characteristics of two devices.

What is claimed is:

1. A lead frame comprising:
   a plurality of leads arranged in parallel, wherein
   each of said leads is constituted by being divided into two portions of an inner lead portion and an outer lead portion,
   said inner lead portion has a fine inner lead portion and a middle inner lead portion for interconnecting said fine inner lead portion and said outer lead portion, said fine inner lead portion has a first thickness,
each of said middle inner lead portion and said outer lead portion has a second thickness and a second width,
said fine inner lead portion has a tip of a first width, and a rear stage expanded in width from the first width of said tip to the second width of said middle inner lead portion,
the first thickness is smaller than the second thickness, and
the first width is smaller than the second width; and
a plurality of spare leads each of which is constituted by being divided into two portions of a spare inner lead portion and a spare outer lead portion, wherein
said spare leads are arranged in parallel to be apart from said leads in areas between said middle inner lead portions of the adjacent leads, and
said spare leads are respectively arranged from a boundary between said middle inner lead portion and said fine inner lead portion of the adjacent lead to the area of said outer lead portion side.

2. A semiconductor device comprising:
a lead frame;
a first semiconductor element; and
a second semiconductor element, wherein:
said lead frame comprises a plurality of leads arranged in parallel;
each of said leads is constituted by being divided into two portions of an inner lead portion and an outer lead portion;
said inner lead portion has a fine inner lead portion and a middle inner lead portion for interconnecting said fine inner lead portion and said outer lead portion;
said fine inner lead portion has a first thickness;
each of said middle inner lead portion and said outer lead portion has a second thickness and a second width;
said fine inner lead portion has a tip of a first width, and a rear stage expanded in width from the first width of said tip to the second width of said middle inner lead portion;
the first thickness is smaller than the second thickness, and the first width is smaller than the second width;
an electrode of said first semiconductor element is connected through flip chip bonding to a respective one of said fine inner lead portions of said lead frame by a bump formed on the electrode;
said second semiconductor element is stuck to a surface opposite a surface of said lead frame on which said first semiconductor element is mounted by a semiconductor element adhesive;
one end of a wire is attached to an electrode disposed on a surface opposite the surface of said second semiconductor element stuck to said lead frame;
the other end of the wire is attached to a respective one of said middle inner lead portions of said lead frame;
resin sealing is executed to include said inner lead portions of said lead frame and said first and second semiconductor elements; and
said outer lead portions of said lead frame are exposed from a resin-sealed portion.

3. A semiconductor device comprising:
a lead frame;
two first semiconductor elements; and
two second semiconductor elements, wherein:
said lead frame comprises a plurality of leads arranged in parallel;
each of said leads is constituted by being divided into two portions of an inner lead portion and an outer lead portion;
said inner lead portion has a fine inner lead portion and a middle inner lead portion for interconnecting said fine inner lead portion and said outer lead portion;
said fine inner lead portion has a first thickness;
each of said middle inner lead portion and said outer lead portion has a second thickness and a second width;
said fine inner lead portion has a tip of a first width, and a rear stage expanded in width from the first width of said tip to the second width of said middle inner lead portion;
the first thickness is smaller than the second thickness, and the first width is smaller than the second width;
said two first semiconductor elements are connected through an anisotropic conductive sheet to front and back sides of said fine inner lead portions of said lead frame by electrodes disposed on said first semiconductor elements and bumps formed on the electrodes;
a space between said first semiconductor elements and said inner lead portions of said lead frame is filled with an epoxy resin;
said two second semiconductor elements are stuck to surfaces opposite surfaces of said first semiconductor elements stuck to said lead frame by a semiconductor element adhesive;
one end of a wire is attached to an electrode disposed on a surface opposite the surface of each of said second semiconductor elements stuck to each of said first semiconductor elements;
the other end of the wire is attached to a respective one of said middle inner lead portions of said lead frame;
resin sealing is executed to include said inner lead portions of said lead frame and said two pairs of first and second semiconductor elements; and
said outer lead portions of said lead frame are exposed from a resin-sealed portion.

4. A semiconductor device comprising:
a lead frame having a plurality of arranged single-piece leads which each have an outer lead portion, a first inner lead portion and a second inner lead portion which is located between said first inner lead portion and said outer lead portion, said first inner lead portion having a first thickness and a first width, and said second inner lead portion having a second thickness which is larger than the first thickness and a second width which is larger than the first width;
a first semiconductor element mounted on said lead frame, said first semiconductor element having a surface and a plurality of first electrodes provided on said surface of said first semiconductor element, and each of said plurality of first electrodes of said first semiconductor element being respectively connected to said first inner lead portions of said plurality of single-piece leads by a bump;
a second semiconductor element mounted on said lead frame, said second semiconductor element having a surface and a plurality of second electrodes provided on said surface of said second semiconductor element, and each of said second electrodes of said second semiconductor element being respectively connected to said second inner lead portions of said plurality of single-piece leads by a wire.

5. A semiconductor device according to the claim 4, wherein said lead frame has a first surface and a second surface which is opposite to the first surface, said first semiconductor element being mounted on said first surface of said lead frame, and said second semiconductor element being mounted on said second surface of said lead frame.

6. A semiconductor device according to the claim 4, wherein said second semiconductor element is formed on said first semiconductor element.

7. A semiconductor device according to the claim 4, further comprising a resin sealing for sealing said lead frame, said first semiconductor element and said second semiconductor element.

8. A semiconductor device according to the claim 7, wherein said outer lead portion of each of said plurality of single-piece leads is exposed from said resin sealing.

9. A semiconductor device according to the claim 4, wherein a first pitch of said first inner lead portions is smaller than a second pitch of said second inner lead portions.

* * * * *